United States Patent
Andersen (10) Patent No.: US 8,232,678 B2
(45) Date of Patent: Jul. 31, 2012

(54) EXTRA POWER STAGE ADDED FOR POP ELIMINATION

(75) Inventor: Kennet Skov Andersen, Søborg (DK)

(73) Assignee: Bang & Olufsen Icepower A/S, Kgs. Lyngby (DK)

( * ) Notice: Subject to any disclaimer, the term of this patent is extended or adjusted under 35 U.S.C. 154(b) by 226 days.

(21) Appl. No.: 12/518,919

(22) PCT Filed: Dec. 14, 2007

(86) PCT No.: PCT/IB2007/055121
§ 371 (c)(1),
(2), (4) Date: Oct. 26, 2009

(87) PCT Pub. No.: WO2008/072212
PCT Pub. Date: Jun. 19, 2008

(65) Prior Publication Data
US 2010/0036539 A1  Feb. 11, 2010

(30) Foreign Application Priority Data
Dec. 15, 2006 (DK) .................. 2006 01649

(51) Int. Cl.
*H02J 1/00* (2006.01)
(52) U.S. Cl. .......... 307/82; 307/112; 307/116; 307/149; 307/151; 330/10; 330/207 A; 330/251
(58) Field of Classification Search .................. 307/82, 307/112, 116, 149, 151; 330/10, 207 A, 330/251
See application file for complete search history.

(56) References Cited

U.S. PATENT DOCUMENTS

| | | |
|---|---|---|
| 6,538,590 B1 | 3/2003 | Gaboriau et al. |
| 6,587,670 B1 | 7/2003 | Hoyt et al. |
| 6,985,034 B1 * | 1/2006 | Prokin et al. .................. 330/251 |
| 7,142,048 B2 * | 11/2006 | Miyagaki et al. ............... 330/10 |
| 7,230,481 B2 * | 6/2007 | Hansen et al. .................. 330/51 |
| 2006/0126864 A1 | 6/2006 | Ryoo et al. |
| 2006/0182266 A1 | 8/2006 | Custinato et al. |
| 2006/0261886 A1 | 11/2006 | Hansen et al. |
| 2007/0139103 A1 | 6/2007 | Roeckner et al. |

* cited by examiner

*Primary Examiner* — Rexford Barnie
*Assistant Examiner* — Toan Vu
(74) *Attorney, Agent, or Firm* — Stites & Harbison PLLC; Douglas E. Jackson (57) ABSTRACT

The invention relates to a pop reduction system for a switching power conversion system (0, 1), which system comprises an analogue control system (0) and a switching power stage (1), where the pop reduction system comprises an extra power stage (2), controllable means (3) for establishing or eliminating an extra signal path from the output of said control system (0) via said extra power stage (2) to the output terminal of said switching power conversion system (0, 1} and control means (34) for controlling said controllable means (3), whereby establishing or elimination of said extra signal path is attained. The invention furthermore relates to a corresponding method for pop reduction and generally to amplifier systems comprising the pop reduction system according to the invention.

16 Claims, 9 Drawing Sheets

Fig. 9

EXTRA POWER STAGE ADDED FOR POP ELIMINATION

TECHNICAL FIELD

This invention relates to a switching power conversion system such as DC-AC, DC-DC or AC-AC conversion systems or any combination of the above mentioned. More specifically, the invention relates to pop elimination in an audio amplifier.

The invention may advantageously be used for improved start-up and close-down in any audio amplifier system, in particular high precision DC-AC power conversion systems such as high efficiency audio amplification.

TECHNICAL BACKGROUND

The pop elimination system (i.e. pop elimination in an audio amplification system) can be a central element of an audio power conversion system.

Most audio power converters are based on a PWM modulator (digital modulator or analogue modulator) that converts a pulse-code-modulated signal (PCM) received from a source such as a CD-player, or an analogue signal preceded by a D/A converter, to for instance pulse-width-modulated signals (digital or analogue PWM modulator). Alternatively the modulator is analogue and is preceded by a D/A converter.

The output signal of the modulator is fed to a power stage where it is amplified. A typical power converter includes a switching power conversion stage, a filter and an analogue control system.

At start-up and close-down of the audio power conversion system a general problem is the presence of an audible signal at the output of the system even though there is no input signal applied to the audio power conversion system. The signal at the output at start-up and close-down is called pop.

A contributing source to the pop can be a DC step because the control system adds DC or because the PWM modulator adds DC.

Another contributing source of the start-up pop can be transients when the control system is started up from a saturated position.

A contributing source of the close-down pop can be non-controllable conduction of the MOSFET at close-down. Depending on the close-down timing in the PWM pulse, the current flowing in the filter can change the close-down timing of the MOSFET.

For eliminating the pop it is desirable to disconnect the output of the amplifier from the transducer at amplifier start-up and amplifier close-down. After the amplifier start-up it is desirable to connect the amplifier slowly to the transducer so that any DC output of the amplifier is slowly ramped at the transducer. Before amplifier close-down it is desirable to disconnect the amplifier output from the transducer so that any DC output of the amplifier is slowly ramped at the transducer. Therefore, it is desirable to include a switch after the power stage, as shown in FIG. 1.

Figure 1:
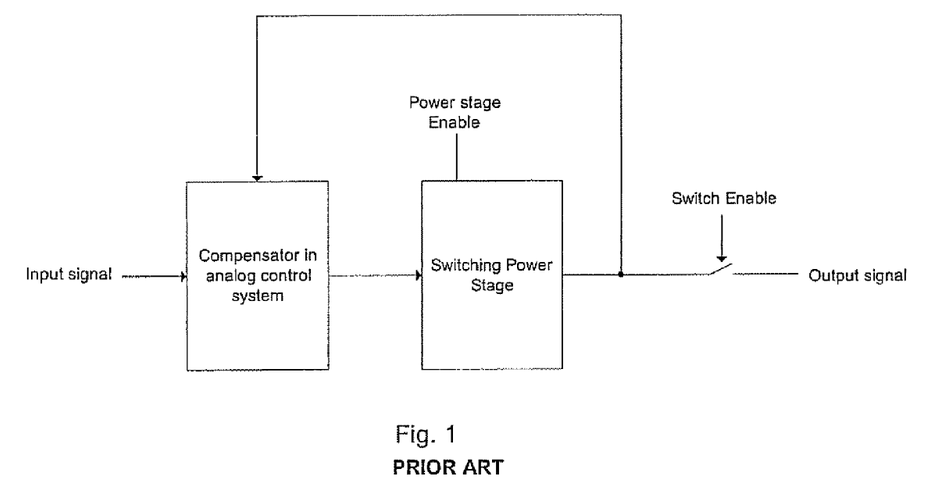
FIG. 1. illustrates a prior art pop elimination system where a switch is added in serial with the output after the feedback control loop.

In FIG. 1 there is shown an amplifier system including a switch in serial with the output of the amplifier. However, the switch shown in FIG. 1 increases the output impedance of the amplifier and furthermore the switch has to be able to handle any output current from the amplifier For this reason, high performance demands are made on the switch.

OBJECTS OF THE INVENTION

Accordingly, a primary object of the invention has been to provide a close-down and start-up technique in an audio power conversion system that overcomes fundamental problems related to prior art techniques.

A further object is to provide a system that can be implemented with low cost.

Yet another object of the invention is to provide a system that is suitable for silicon implementation.

Still another object of the invention is to reduce the number of external components when the system is implemented in an ASIC.

A further object of the invention is to increase the efficiency of said power conversion system.

SUMMARY OF THE INVENTION

The above and further objects and advantages are attained according to the invention by the provision of a pop reduction system for use in a switching power conversion system, which system comprises an analogue or digital control system providing an output signal directly or via further processing stages to a switching power stage, where the pop reduction system comprises:
an extra power stage;
controllable means for establishing or eliminating an extra signal path from the output of said control system via said extra power stage to the output terminal of said switching power conversion system;
control means for controlling said establishing or elimination of said extra signal path.

According to the invention, said establishing or elimination or said extra signal path can take place rapidly or slowly, i.e., according to any given, desirable function of time.

According to a specific embodiment of the invention, the above objects are attained by adding an extra power stage to the audio power converter system and a switch in serial with the extra power stage. Since the extra power stage will only be used when there is no input to the amplifier, the extra power stage can be small compared to the original power stage. The extra power stage can be either a switching power stage (for example a half bridge or full bridge power stage) or an analogue power stage (for example a class AB power stage). Also the switch can be very small since the switch only has to handle the currents when there is no input to the amplifier.

The extra power stage can be connected to the output with a switch. The switch can be closed and opened slowly or fast depending on the demands in the start-up and close-down sequence. Thus, in the present context the term "switch" is to be understood as a device having a transfer function that can be varied between 0 dB (i.e. no attenuation through the device) and substantially −∞ dB (i.e. a very high attenuation through the device) according to a given, desired function of time. Instead of connecting the extra power stage by means of a switch, enabling and disabling of the extra power stage can be used to connect the extra power stage to the output.

If a demodulation filter is used in the audio power converter system, the switch connected to the extra power stage can be connected to the output either before or after the demodulation filter.

The present invention furthermore relates to a pop reduction method to be applied during the START-UP and CLOSE-DOWN periods of a switching power conversion system. Thus, according to the invention there is furthermore provided:

A method of pop reduction during START-UP of a switching power conversion system comprising an analogue or digital control system and a switching power stage, said method comprising:

(a) the provision of an extra power stage, the input terminal of which is connected to the output terminal of said control system and the output terminal of which is connected to the output terminal of the switching power conversion system, either directly or through a controllable means;
(b) if the switching power stage is not already disabled disabling said switching power stage;
(c) slowly connecting the output of the extra power stage (2) to the output of the switching power conversion system;
(d) rapidly disconnecting the extra power stage from the output of the switching power conversion system and enabling the switching power stage;

After the above sequence of steps, the system is now functioning as a switching amplifier for instance corresponding to the prior art amplifier shown in FIG. 1, but without the switch at the output terminal of the amplifier.

According to the invention there is furthermore provided:
A method of pop reduction during CLOSE-DOWN of a switching power conversion system, comprising an analogue or digital control system and a switching power stage, said method comprising
(a) the provision of an extra power stage, the input terminal of which is connected to the output terminal of said control system and the output terminal of which is connected to the output terminal of the switching power conversion system, either directly or through a controllable means;
(b) determining the correct timing for close-down;
(c) rapidly connecting the output of the extra power stage to the output of the switching power conversion system and disabling said switching power stage;
(d) slowly disconnecting the extra power stage from the output of the switching power conversion system.

After the above sequence of steps, the system (amplifier) is now disabled.

According to the invention, an extra period (period 3) can be included between the end of period 1 and the beginning of period 2, where the control system (0) is clamped and released.

The third period may actually comprise two different processes:
(1) Clamping (locking) the control system such that it does not saturate, when no output stage is connected to its output. Due to the feedback signal of the control system, the control system will always attempt to obtain a voltage at the output of the amplifier. If no output stage is present, the control system can not control the level of the output voltage and the control system will consequently often be brought to saturation.
(2) Establishing a control feedback connection after the extra power stage before the switch In a self-oscillating control system a feedback signal is required in order to make the PWM modulator and control system function. This connection is required for the proper functioning of the start-up and close-down processes. During normal operation of the amplifier, the connection is not desirable, as the loop gain in the control system is less.

The Start-Up Sequence With 2 Periods Thus Comprises:
At the beginning: The extra power stage is not connected to the output, the switching power stage is disabled. The amplifier is disabled.
Period 1: The extra power stage is slowly connected to the output The switching power stage is disabled
End of period 1: The extra power stage is connected to the output. The switching power stage is disabled. The amplifier is functioning as an amplifier using the extra power stage.
Period 2: The extra power stage is rapidly disconnected from the output and the switching power stage is enabled. If a switch power stage is used for the extra power stage, the correct timing in the PWM pulse can be important. The correct timing of the close-down depends on the components in the design.
End of period 2: The extra power stage is disconnected from the output. The switching power stage is enabled. The amplifier is functioning as a switching amplifier.

An extra period can be included in between the end of period 1 and the beginning of period 2.

In case a non-self-oscillating modulator is used or a self-oscillating modulator and an analogue extra power stage is used (for example a class AB power stage), the compensator block can be clamped during period 1. The clamping is slowly released during the new period. The addition of the extra period will in many cases reduce the start-up time, since the compensator block will in many cases saturate when the extra power stage is not connected to the output. The initialisation time from saturated to correct bias point will usually take some time. If the compensator block is clamped, the compensator does not have to find its correct bias point from the saturated point, but instead from the clamped point.

In case a self-oscillating PWM modulator and an extra switching power stage is used there is—in order to attain oscillation when the extra power stage is not connected to the output—included a feedback signal just after the extra switching power stage. At period 1 this feedback signal is connected between the compensator and the extra power stage. The connection is slowly broken during this new period. Braking the connection will in many cases lead to higher error attenuation of errors in the power stage, both in the period when the extra power stage is used and when the original power stage is used.

The Close-Down Sequence With 2 Periods Thus Comprises:
At the beginning: The correct timing for close-down is determined. The correct timing of the close-down depends on the components in the design. The extra power stage is disconnected from the output and the switching power stage is enabled. The amplifier is functioning as a switching amplifier.
Period 2: The extra power stage is rapidly connected to the output. The switching power stage is disabled.
End of period 2: The extra power stage is connected to the output. The switching power stage is disabled. The amplifier is functioning as an amplifier using the extra power stage.
Period 1: The extra power stage is slowly disconnected from the output. The switching power stage is disabled.
End of period 1. The extra power stage is not connected to the output. The switching power stage is disabled. The amplifier is disabled.

An extra period can be included in between the end of period 2 and beginning of period 1.

In case a non-self-oscillating modulator is used or a self-oscillating modulator and an analogue extra power stage is used (for example a class AB power stage), the compensator block can be clamped during period 1. The clamping is slowly activated during the new period. The adding of the extra stage will in many cases reduce the close-down time, since the compensator block will in many cases saturate when the extra power stage is not connected to the output. It will usually take some time before saturation is reached. If the compensator block is clamped, the compensator does not have to find its correct bias point from the saturated point, but instead from the clamped point.

In case a self-oscillating PWM modulator and an extra switching power stage are used there is—in order to attain oscillation when the extra power stage is not connected to the output—included a feedback signal just after the extra switching power stage. At period 1 this feedback signal is connected between the compensator and the extra power stage. The connection is slowly established during this new period. Braking the connection will in many cases lead to higher error attenuation of errors in the power stage, both in the period when the extra power stage is used and when the original power stage is used.

Above, the terms "rapidly" and "slowly" are repeatedly used for describing the dynamic behaviour of the switching process during start-up and close-down. Typically, "slowly" indicates a time interval from approximately 10 ms to 1 s and "rapidly" indicates a time interval from 1 ns to 1 µs, which latter merely indicates a switching process carried out as fast as possible. Other time intervals may, however, also be applied The present invention may advantageously be used for improved start-up and close-down in any audio amplifier system, in particular high precision DC-AC power conversion systems such as high efficiency audio amplification.

BRIEF DESCRIPTION OF THE DRAWINGS

Prior art systems and preferred embodiments of the present invention will be further described in the following, with reference to the appended drawings and simulation sheets.

DETAILED DESCRIPTION OF THE PREFERRED EMBODIMENTS

Figure 2:
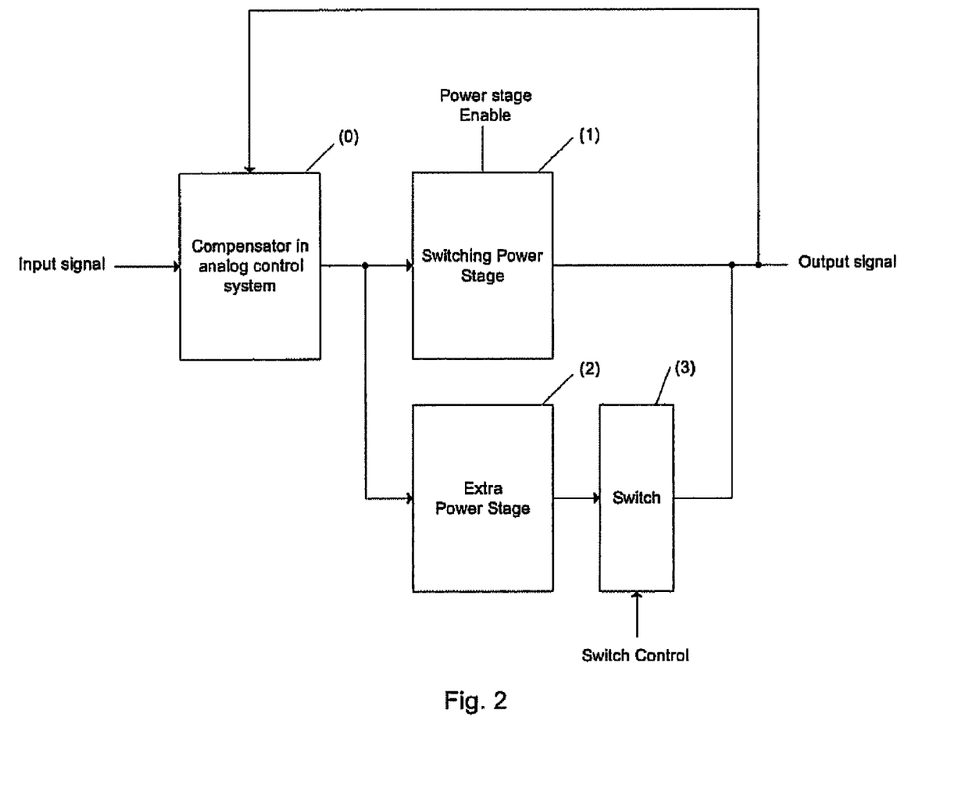
FIG. 2. illustrates a first embodiment of the invention as a general block diagram.

A general block diagram of a first preferred embodiment of the invention is shown in FIG. 2 and comprises a compensator in the control system 0, a power stage 1, an extra power stage 2 and a switch 3 between the output of the amplifier and the output of the extra power stage 3.

The compensator in the control system 0 compensates for errors in the power stage 1. The power stage block 1 includes a switching power conversion stage. The extra power stage block 2 includes an extra power conversion stage. The switch block 3 handles the connection of the extra power stage 2 to the output signal.

Figure 3:
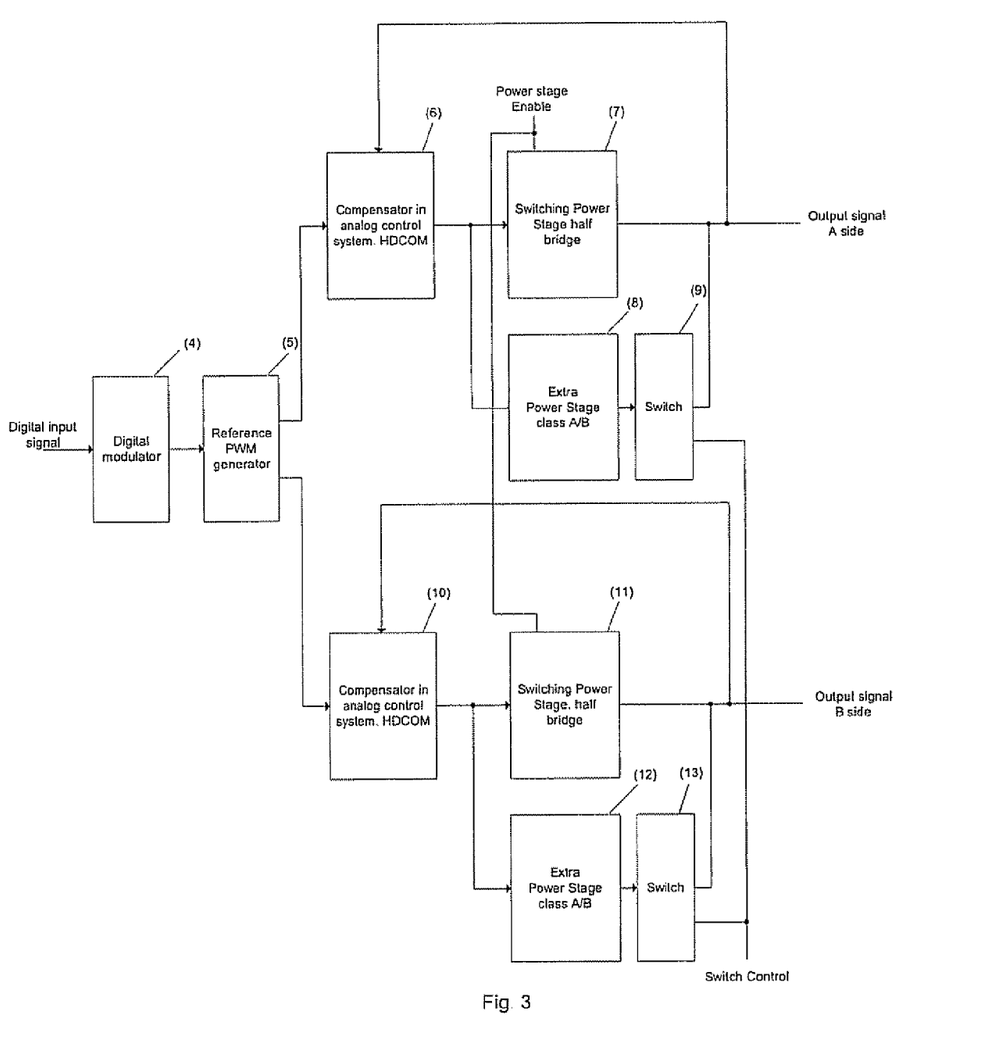
FIG. 3. illustrates a block diagram of a second embodiment of the invention.

A second preferred embodiment of the invention is shown in FIG. 3. The block diagram includes a digital PCM to PWM modulator 4 for converting the digital input signal to a pulse-width-modulated signal, a reference PWM generator 5, a compensator in an analogue control system for the A-side 6, a compensator in an analogue control system for the B-side 10, a switching power stage implemented as a half bridge for the A-side 7, a switching power stage implemented as a half bridge for the B-side 11, an extra power stage of class A/B type 8 for the A-side, an extra power stage of class A/B type 12 for the B-side, a switch 9 between the output of the amplifier and the output of the extra power stage for the A-side and a switch 13 between the output of the amplifier and the output of the extra power stage for the B-side.

Figure 4:
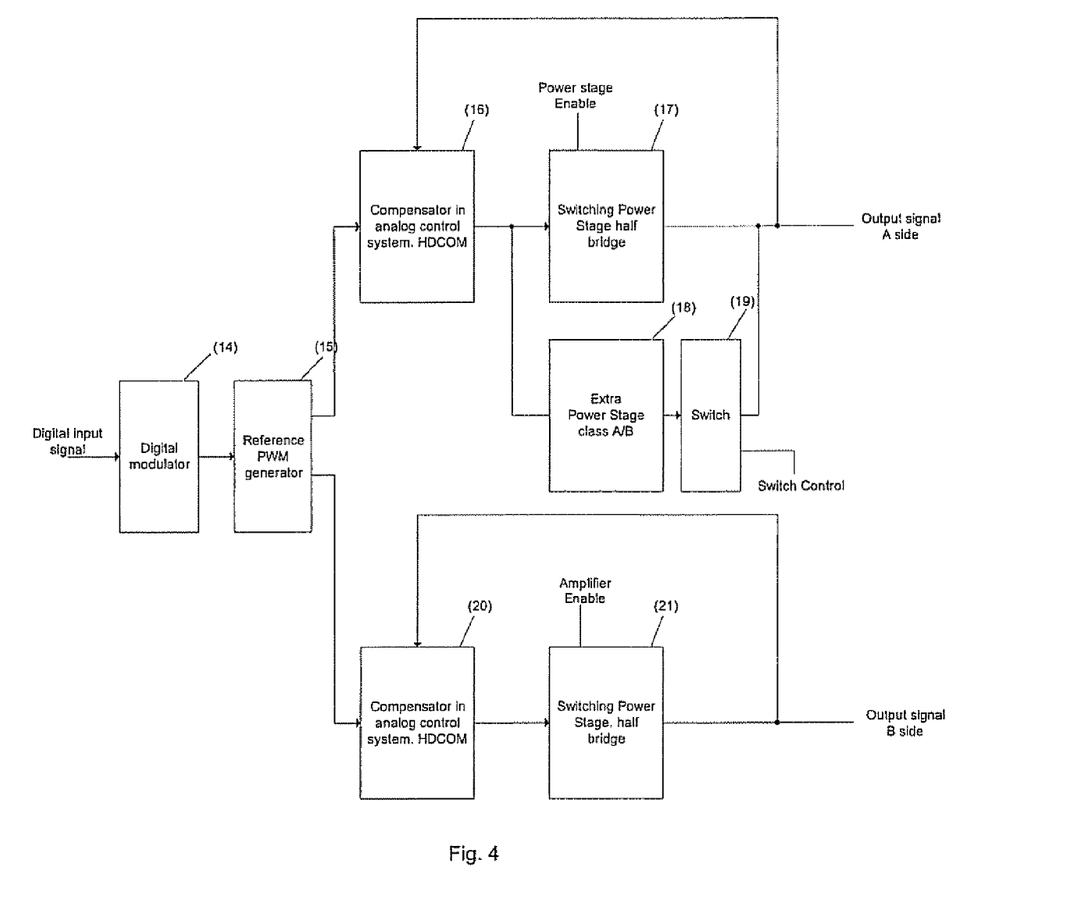
FIG. 4. illustrates a block diagram of a third embodiment of the invention.

A third preferred embodiment of the invention is shown in FIG. 4 comprising a digital PCM to PWM modulator 14 for converting the digital input signal to a pulse-width-modulated signal, a reference PWM generator 15, a compensator in an analogue control system 16 for the A-side, a compensator in an analogue control system 20 for the B-side, a switching power stage implemented as a half bridge 17 for the A-side, a switching power stage implemented as a half bridge 21 for the B-side, an extra power stage of class A/B type 18 for the A-side and a switch 19 between the output of the amplifier and the output of the extra power stage 18 for the A-side.

Figure 5:
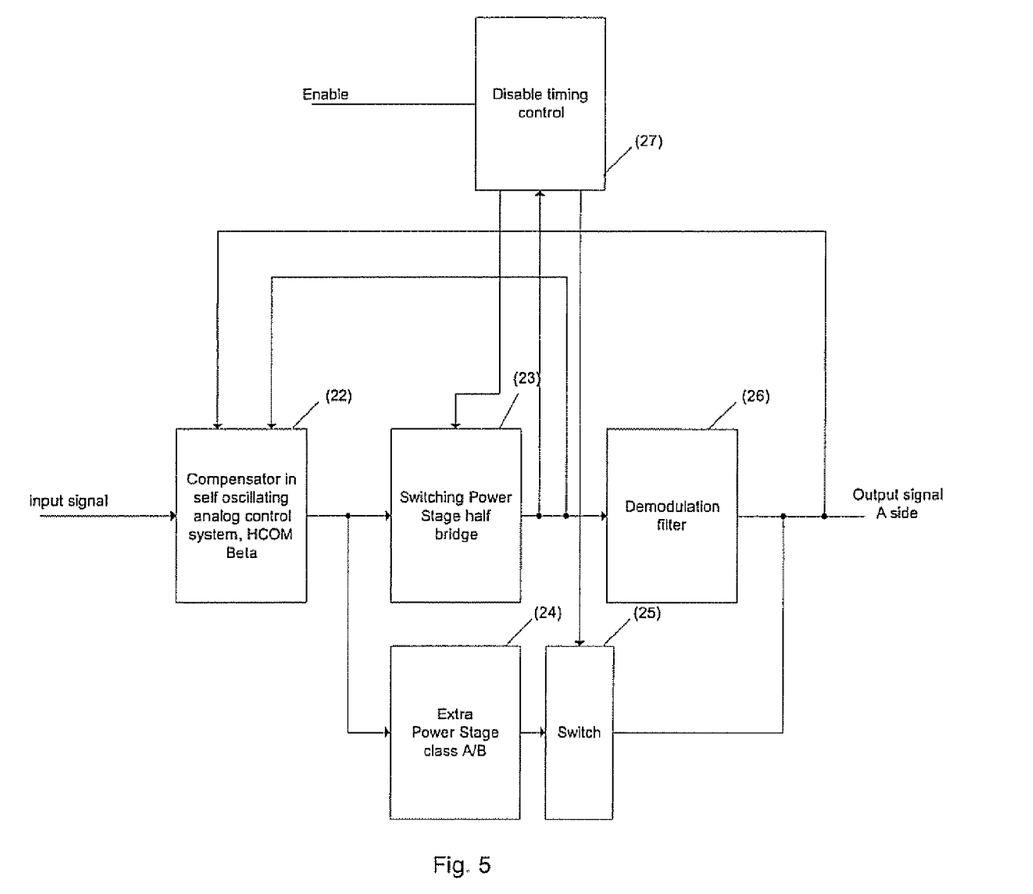
FIG. 5. illustrates a block diagram of a forth embodiment of the invention.

A forth preferred embodiment of the invention is shown in FIG. 5. The embodiment includes a compensator in an analogue self-oscillating control system 22, a switching power stage implemented as a half bridge 23, an extra power stage of class A/B type 24, a demodulation filter of the PWM signal 26, a switch between the output of the amplifier after the demodulation filter 26 and the output of the extra power stage 24 and a disable control block 27 that controls the timing of the switch 25.

Figure 6:
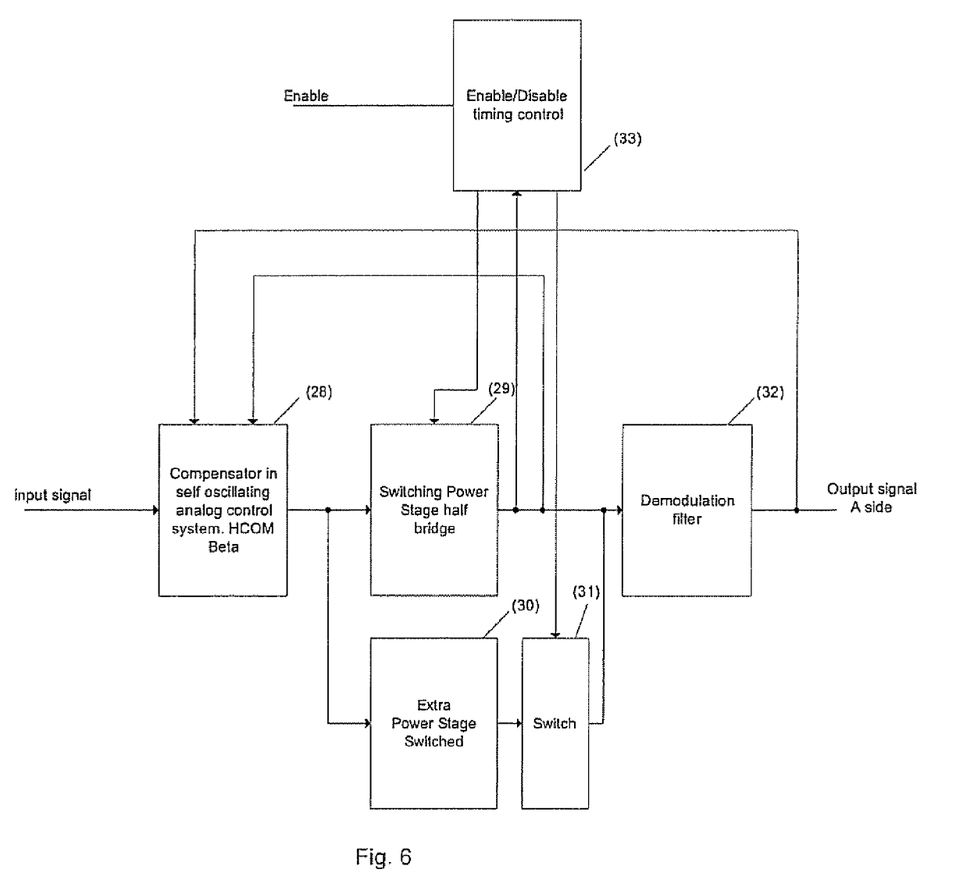
FIG. 6. illustrates a block diagram of a fifth embodiment of the invention.

A fifth preferred embodiment of the invention is shown in FIG. 6. The block diagram includes a compensator in an analogue self-oscillating control system 28, a switching power stage implemented as a half bridge 29, an extra power stage of class A/B type 30, a demodulation filter of the PWM signal 32, a switch 31 between the output of the power stage 29 before the demodulation filter 32 and the output of the extra power stage 30 and a disable control block 33 that controls the timing of the switch 31.

Figure 7:
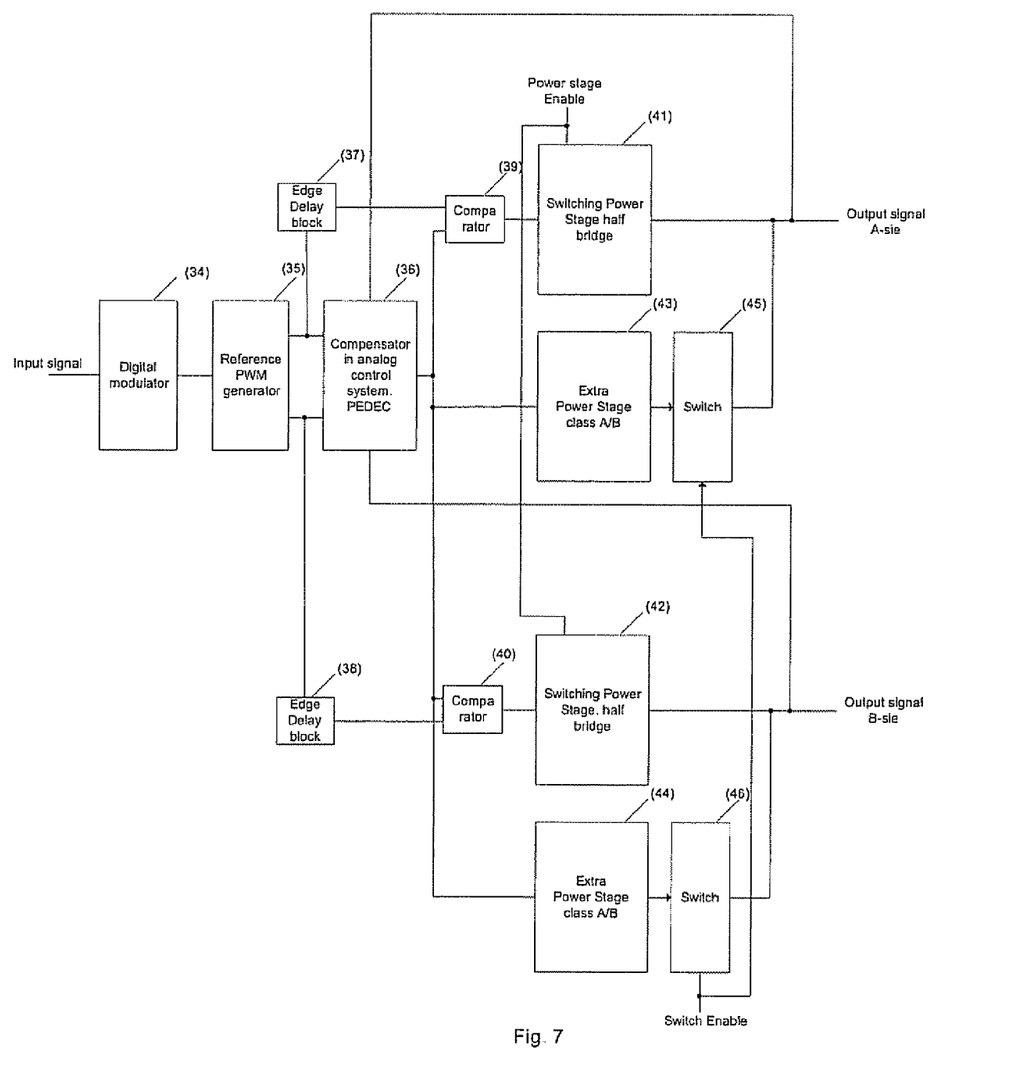
FIG. 7. illustrates a block diagram of a sixth embodiment of the invention.

A sixth preferred embodiment of the invention is shown in FIG. 7 compromising a digital PCM to PWM modulator 34 for converting the digital input signal to a pulse-width-modulated signal, a reference PWM generator 35, a compensator in an analogue control system combined for the A-side and B-side named PEDEC 36, an edge delay block 37 for the A-side, an edge delay block 38 for the B-side, a comparator 39 for the A-side, a comparator 40 for the B-side, a switching power stage 41 implemented as a half bridge for the A-side, a switching power stage 42 implemented as a half bridge for the B-side, an extra power stage of class A/B type 43 for the A-side an extra power stage of class A/B type 44 for the B-side, a switch 45 between the output of 46 between the output of the amplifier and the output of the extra power stage 43 for the B-side.

Figure 8:
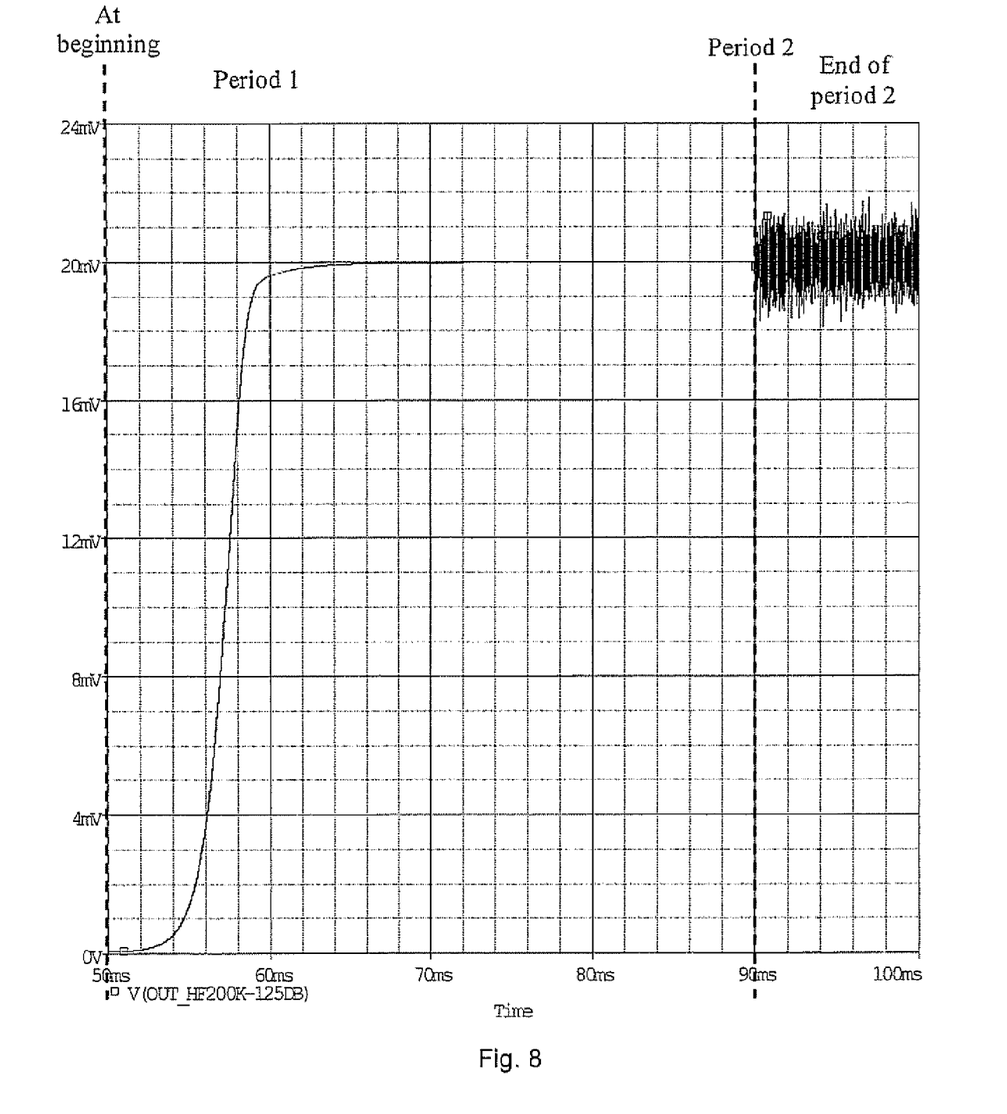
FIG. 8. illustrates a simulation of start-up in the system at FIG. 3.

Referring to FIG. 8 there is shown a simulation of the start-up of the second embodiment. The low-pass-filtered output signal of the amplifier is shown. The low-pass filter cuts off heavily above 20 kHz. At the beginning, the amplifier is closed down. During period 1, the extra power stage is slowly connected to the output of the amplifier and the output is ramped up to a DC offset of 20 mV added by the control system. During period 2, the extra power stage is rapidly disconnected from the output and the power stage is enabled. At the end of period 2 the amplifier is functioning normally.

Figure 9:
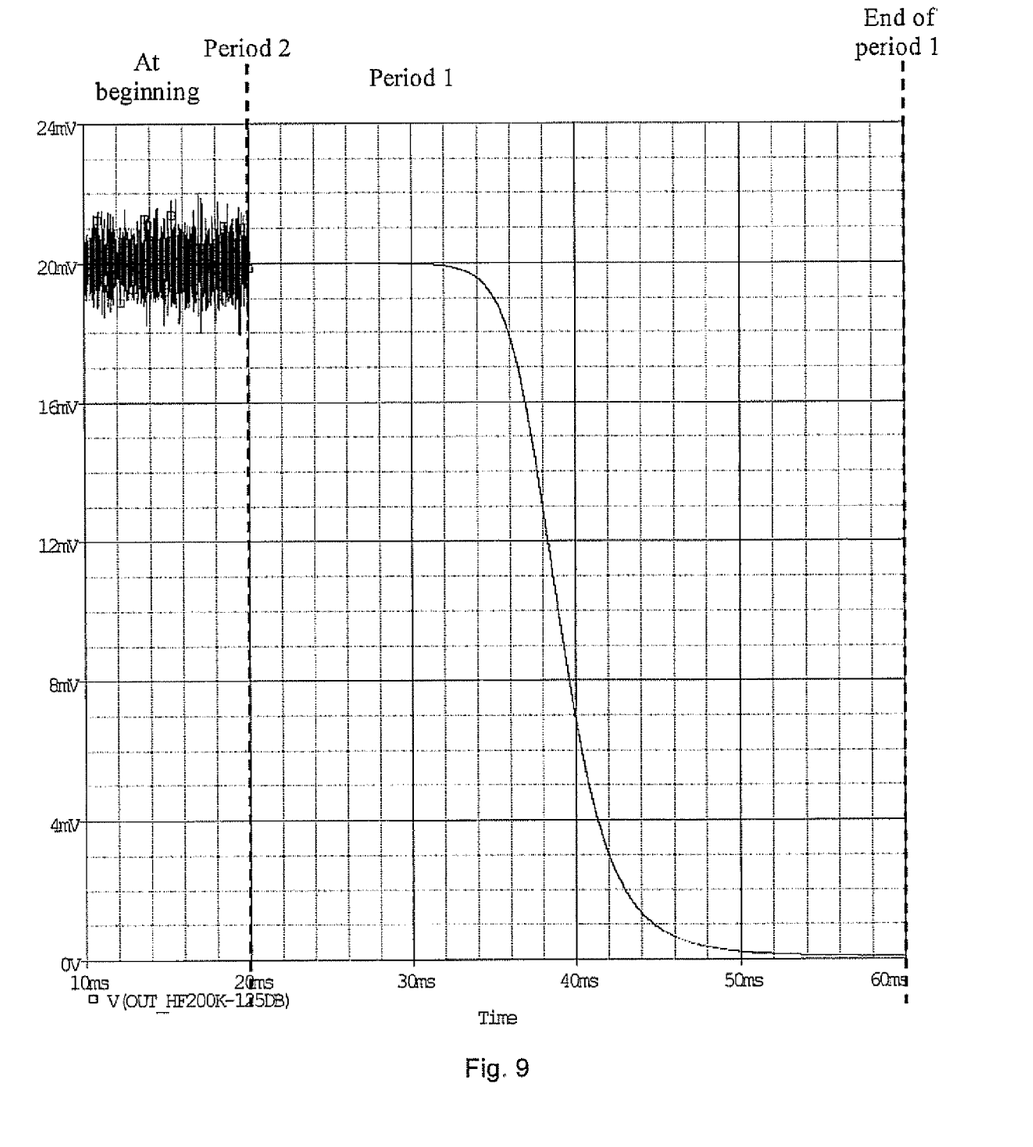
FIG. 9. illustrates a simulation of close-down in the system at FIG. 3.

Referring to FIG. 9 there is shown a simulation of the close-down of the second embodiment. The low-pass-filtered output signal of the amplifier is shown. The low pass filter cuts off heavily above 20 kHz. At the beginning the amplifier is functioning normally. During period 2 the power stage is disabled and the extra power stage is rapidly connected to the output. During period 1, the extra power stage is slowly disconnected from the output of the amplifier and the output is ramped down to a DC offset of 0 mV. At the end of period 1, the amplifier is closed down.

The invention claimed is:

1. A pop reduction system for a switching power conversion system comprising an analogue or digital control system and a switching power stage, said pop reduction system comprising:
   an extra power stage, the input terminal of which is connected to the output terminal of said control system, and the output terminal of which is connected to the output terminal of said switching power conversion system through a switch; and
   a control mechanism for controlling said switch, whereby establishing or elimination of an extra signal path is attained; and
   wherein said switch has a transfer function that is variable between 0 dB and -∞ dB according to a given, desired function of time, thereby enabling a ramping of a voltage provided by the switching power conversion system during a predefined time period.

2. A pop reduction system according to claim 1, where said switch is inserted between the output of said extra power stage and the output terminal of said switching power conversion system.

3. A pop reduction system according to claim 1, where said switch is implemented in the extra power stage by enabling or disabling of the extra power stage under the control of said control mechanism.

4. A pop reduction system according to claim 1, wherein a switching power stage is used for the extra power stage.

5. A pop reduction system according to claim 1, wherein an analogue class-A/B power stage is used for the extra power stage.

6. A method of pop reduction during START-UP of a switching power conversion system comprising an analogue or digital control system and a switching power stage, said method comprising the steps of:
   (a) providing an extra power stage, the input terminal of which is connected to the output terminal of said control system and the output terminal of which is connected to the output terminal of the switching power conversion system, either directly or through a controllable mechanism;
   (b) if the switching power stage is not already disabled, disabling said switching power stage;
   (c) slowly connecting the output of the extra power stage to the output of the switching power conversion system, so that a voltage provided by the switching power conversion system is ramped up during a predefined period of time; and
   (d) rapidly disconnecting the extra power stage from the output of the switching power conversion system and enabling the switching power stage.

7. A method of pop reduction during CLOSE-DOWN of a switching power conversion system comprising an analogue or digital control system and a switching power stage, said method comprising the steps of:
   (a) providing an extra power stage, the input terminal of which is connected to the output terminal of said control system and the output terminal of which is connected to the output terminal of the switching power conversion system, either directly or through a controllable mechanism;
   (b) determining the correct timing for close-down;
   (c) rapidly connecting the output of the extra power stage to the output of the switching power conversion system and disabling said switching power stage; and
   (d) slowly disconnecting the extra power stage from the output of the switching power conversion system, so that a voltage provided by the switching power conversion system is ramped down during a predefined period of time.

8. A method of pop reduction according to claim 6, where an extra period is added between steps (c) and (d), where the control system is clamped and released.

9. A method of pop reduction according to claim 6, where an extra period is added between steps (c) and (d), where a control feedback connection after the extra power stage before the switch is established.

10. A method of pop reduction according to claim 7, where an extra period is added between steps (c) and (d), where the control system is clamped and released.

11. A method of pop reduction according to claim 7, where an extra period is added between steps (c) and (d), where a control feedback connection after the extra power stage before the switch is established.

12. A high efficiency audio amplifier system, including a high precision DC-AC power conversion system, comprising a pop reduction system according to claim 1.

13. A method of operating a high efficiency audio amplifier system, including a high precision DC-AC power conversion system, comprising the steps of operating a pop reduction during START-UP according to claim 6.

14. A pop reduction system according to claim 1, where said predefined time period is greater than 10 ms.

15. A method of pop reduction according to claim 6, where said predefined period of time is greater than 10 ms.

16. A method of pop reduction according to claim 7, where said predefined period of time is greater than 10 ms.

* * * * *